(12) United States Patent
Chang et al.

(10) Patent No.: US 7,118,971 B2
(45) Date of Patent: Oct. 10, 2006

(54) METHOD FOR FABRICATING TRENCH POWER DEVICE

(75) Inventors: Jen-Chieh Chang, Hsinchu (TW); Yi-Fu Chung, Hsinchu (TW); Tun-Fu Hung, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 10/962,350

(22) Filed: Oct. 8, 2004

(65) Prior Publication Data

US 2005/0287734 A1    Dec. 29, 2005

(30) Foreign Application Priority Data

Jun. 25, 2004  (TW)  ............................... 93118488 A

(51) Int. Cl.
*H01L 21/336* (2006.01)
*H01L 29/76* (2006.01)

(52) U.S. Cl. ...................... 438/270; 438/259; 257/330; 257/333; 257/E29.2; 257/E21.4

(58) Field of Classification Search .................... None
See application file for complete search history.

(56) References Cited

U.S. PATENT DOCUMENTS

| | | | |
|---|---|---|---|
| 6,319,776 B1 * | 11/2001 | Tung | 438/270 |
| 6,437,386 B1 | 8/2002 | Hurst et al. | |
| 6,444,528 B1 * | 9/2002 | Murphy | 438/270 |
| 2004/0014263 A1 * | 1/2004 | Fujishima et al. | 438/193 |

* cited by examiner

*Primary Examiner*—Dung A. Le
(74) *Attorney, Agent, or Firm*—Townsend and Townsend and Crew LLP

(57) ABSTRACT

Embodiments of the invention relate to a fabrication method of an electronic device, more particularly to a fabrication method of a power device in which an oxide layer at the bottom of the trench is provided to reduce Miller capacitance and further reduce RC delay. In one embodiment, a method for forming an oxide layer at the bottom of a trench comprises providing a first substrate with at least one trench therein; forming a first oxide layer on the bottom and sidewalls of the trench; removing the first oxide layer at the bottom of the trench; and forming a second oxide layer at the bottom of the trench.

52 Claims, 4 Drawing Sheets

METHOD FOR FABRICATING TRENCH POWER DEVICE

CROSS-REFERENCES TO RELATED APPLICATIONS

This application claims priority from R.O.C. Patent Application Ser. No. 093118488, filed Jun. 25, 2004, the entire disclosure of which is incorporated herein by reference.

BACKGROUND OF THE INVENTION

The present invention relates to a method for fabricating a power device, and more particularly, to a method for fabricating a trench power device by forming an oxide layer at the bottom of a trench.

U.S. Pat. No. 6,437,386 to Hurst et al., the entirety of which is fully incorporated by reference herein, discloses total gate charge as an important parameter in a trench power MOSFET. In some applications of conventional trench power MOSFETs, such as DC-DC converters, the lower the gate charge the better is the efficiency of the overall design. One major component of the total gate charge is the charge required to supply what is known as the Miller capacitance.

The Miller capacitance is a parasitic capacitance that forms between the gate and the drain. The Miller capacitance is an effective increase of the gate to drain capacitance effect due to a rising drain current in the MOSFET active state. As a result, a higher proportion of the total gate charge flows through the gate-drain capacitance, and the rate of the rise of the gate to drain voltage is reduced. Thus, an effective way to lower the gate charge is to reduce the Miller capacitance. One method to decrease the Miller capacitance is to increase the thickness of the gate dielectric. A uniformly thicker gate dielectric layer, however, requires higher gate charge which results in lower efficiency.

Accordingly, there is a need for an improved process for fabricating a trench power device that can prevent the aforementioned RC delay problem due to the Miller capacitance.

BRIEF SUMMARY OF THE INVENTION

Embodiments of the present invention are directed to a fabrication method of an electronic device, more particularly to a fabrication method of a power device ameliorating the aforementioned Miller capacitance problem. An oxide layer at the bottom of the trench is provided to reduce Miller capacitance and further reduce RC delay.

In accordance with an aspect of the present invention, a method for forming an oxide layer at the bottom of a trench comprises providing a first substrate with at least one trench therein; forming a first oxide layer on the bottom and sidewalls of the trench; removing the first oxide layer at the bottom of the trench; and forming a second oxide layer at the bottom of the trench.

In some embodiments, the first substrate is formed by providing a substrate; forming a third oxide layer on the substrate; forming a silicon nitride layer on the third oxide layer; patterning the silicon nitride layer and the third oxide layer to form an opening; and etching the substrate along the opening to form the trench therein. The first oxide is formed by thermal oxidation. The second oxide is formed by forming a fourth oxide layer on the first substrate filling the trench; removing the fourth oxide layer on the first substrate and on the sidewalls of the trench; and densification of the fourth oxide layer to form the second oxide layer. The fourth oxide layer is formed by chemical vapor deposition (CVD). The CVD is a high ozone-tetraethyloxysilane (O3-TEOS) CVD process. Removing the fourth oxide layer on the first substrate and on the sidewalls of the trench is performed by wet etching. The wet etching is performed by an HF based solution. The HF based solution is a buffered-oxide-etch (BOE) solution. The densification is performed by annealing.

In specific embodiments, the first substrate comprises a silicon substrate. Removing the first oxide layer at the bottom of the trench is performed by dry etching. The method may further comprise removing the remaining silicon nitride layer. The third oxide layer is formed by thermal oxidation. The silicon nitride layer is formed by chemical vapor deposition. Patterning the silicon nitride layer comprises forming a photoresist layer on the silicon nitride layer; exposing and developing the photoresist layer to expose the silicon nitride layer; and removing the exposed the silicon nitride layer.

In accordance with another aspect of the present invention, a method for fabricating a power device comprises providing a substrate; forming a third oxide layer on the substrate; forming a silicon nitride layer on the third oxide layer; patterning the silicon nitride layer and the third oxide layer to form an opening; etching the substrate along the opening to form a trench therein; forming a first oxide layer on the bottom and sidewalls of the trench; removing the first oxide layer at the bottom of the trench; and forming a second oxide layer at the bottom of the trench.

In accordance with another aspect of this invention, a method for fabricating a power device comprises providing a substrate; forming a third oxide layer on the substrate; forming a silicon nitride layer on the third oxide layer; patterning the silicon nitride layer and the third oxide layer to form an opening; etching the substrate along the opening to form a trench therein; forming a first oxide layer on the bottom and sidewalls of the trench; removing the first oxide layer at the bottom of the trench; forming a second oxide layer at the bottom of the trench; removing the remaining silicon nitride layer; and removing the first oxide on the sidewalls of the trench and the remaining third oxide layer.

DETAILED DESCRIPTION OF THE INVENTION

Figure 1:
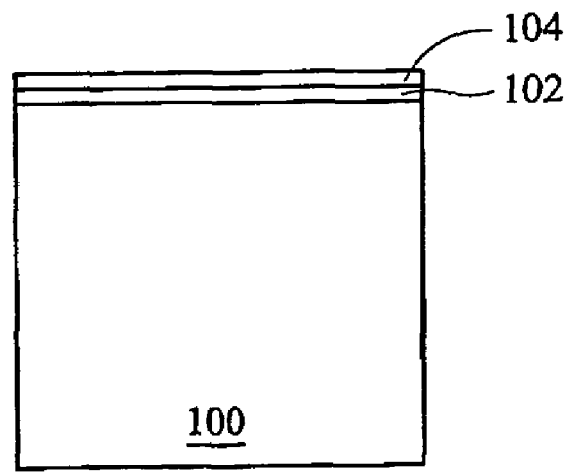
FIGS. 1 to 7 are schematic cross-sections illustrating a method for fabricating a trench power device according to an embodiment of the invention.

Referring to FIG. 1, a substrate 100 is provided. The substrate 100 can be a bare silicon substrate, a P-type doped silicon substrate, or an N-type doped substrate. Alternatively, the substrate 100 can also have printed alignment marks for lithography. An oxide layer 102 is formed on the substrate 100. The oxide layer 102 (also referred as the third oxide in this embodiment) can be formed by thermal oxidation, for example. A silicon nitride layer 104 is consecutively formed on the oxide layer 102. The silicon nitride layer 104 can be formed by chemical vapor deposition (CVD), for example.

The stress of the silicon nitride layer 104 is relieved by the oxide layer 102. The oxide layer 102 can also be omitted if the stress is not an important issue.

According to an embodiment of the invention, the silicon nitride layer 104 is formed by a chemical vapor deposition at a temperature in a range of approximately 700 to 800° C., at a pressure in a range of approximately 0.2 to 0.5 torr, with $SiH_2Cl_2$ at a flow rate in a range of approximately 30 to 50 sccm, and $NH_3$ at a flow rate in a range of approximately 300 to 500 sccm. The silicon nitride layer 104 is preferably formed at a temperature of 750° C., at a pressure of 0.3 torr, with $SiH_2Cl_2$ at a flow rate of 40 sccm, and $NH_3$ at a flow rate of 400 sccm.

The silicon nitride layer 104 can serve as an etching mask.

Figure 2:
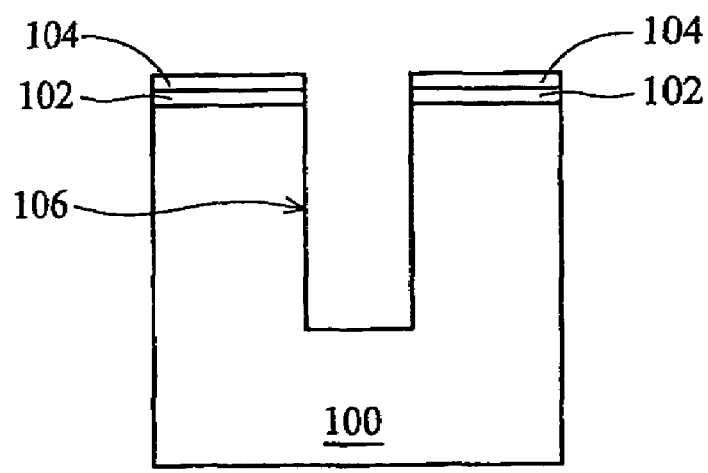

Referring to FIG. 2, the silicon nitride layer 104 and oxide layer 102 are lithographically patterned to form an opening exposing the substrate 100. The substrate 100 is etched using the patterned silicon nitride layer 104 as a mask to form a trench 106 therein.

The steps of patterning the silicon nitride 104 and oxide layer 102 further comprises forming a photoresist layer (not shown) on the silicon nitride layer 104, and exposing and developing the photoresist layer to form a desired trench pattern. The silicon nitride 104 and oxide layer 102 are sequentially removed to expose the substrate 100. The exposed substrate is etched to form a trench 106. The above steps can be completed in a single step or in multiple steps.

Alternatively, if the oxide layer 102 is omitted, the substrate is directly exposed after a portion of the silicon nitride is removed.

Figure 3:
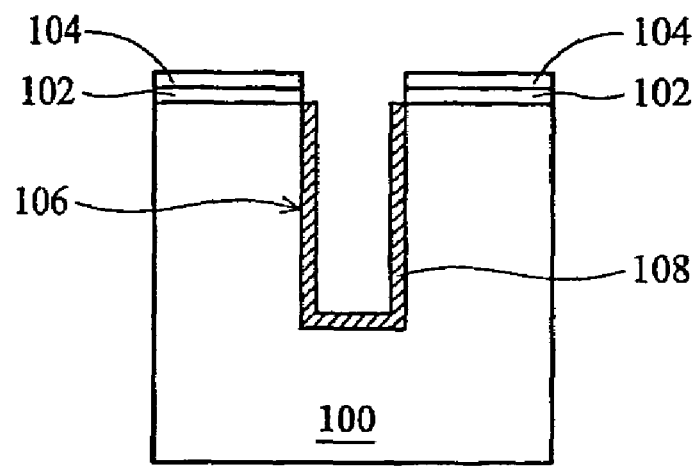

Referring to FIG. 3, an oxide layer 108 is conformally formed on the substrate 100 covering the bottom and sidewalls of the trench 106. The oxide layer 108 also referred as the first oxide in this embodiment) is formed using thermal oxidation at a thickness in a range of approximately 100 to 400Å, for example.

According to an embodiment of the invention, the oxide layer 108 is formed by thermal oxidation at a temperature in a range of approximately 750 to 1000° C., at normal pressure, with $H_2$ flow rate in a range of approximately 3000 to 5000 sccm, and with $O_2$ flow rate in a range of approximately 3000 to 5000 sccm in 10 to 30 min. The oxide layer 108 is preferably formed at a temperature of 850° C., at normal pressure, and with a $H_2/O_2$ flow rate ratio of 4000/4000 sccm in 20 min.

Figure 4:
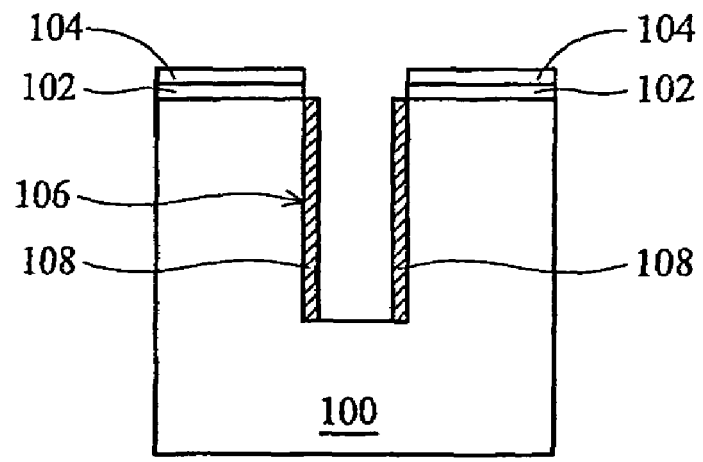

Referring to FIG. 4, the oxide layer 108 at the bottom of the trench 106 is removed to expose the bottom of the trench 106. The oxide layer 108 is typically removed using dry etching, such as plasma enhanced etching.

Figure 5:
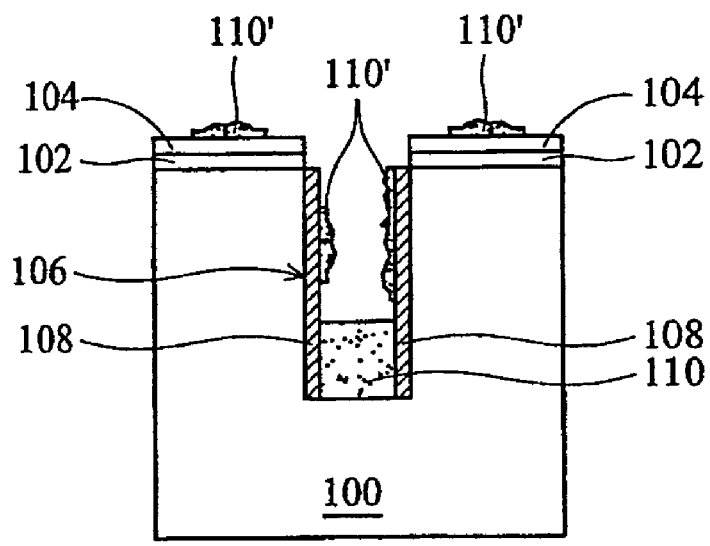

Referring to FIG. 5, an oxide layer 110 is formed at the bottom of the trench 106. The oxide layer 110 (also referred as the second oxide in this embodiment) is preferably formed using a chemical vapor deposition, more preferably, a high ozone-tetraethyloxysilane ($O_3$-TEOS) CVD process.

According to an embodiment of the invention, the oxide layer 110 is formed by high ozone-tetraethyloxysilane ($O_3$-TEOS) CVD process at a temperature in a range of approximately 300 to 500° C., at a pressure in a range of approximately 350 to 550 torr, with $O_3$ flow rate in a range of approximately 4000 to 6000 sccm, and with tetraethyloxysilane (TEOS) flow rate in a range of approximately 175 to 375 sccm. The distance between an electrode and the substrate is in a range of approximately 150 to 350 mil ($10^{-3}$in). The oxide layer 110 is preferably formed at a temperature of 400° C., at a pressure of 450 torr, with $O_3$ flow rate of 5000 sccm, and with tetraethyloxysilane (TEOS) flow rate of 275 sccm. The distance between the electrode and the substrate is preferably 250 mil ($10^{-3}$in).

During high ozone-tetraethyloxysilane ($O_3$-TEOS) CVD, oxide layer can only be formed on a non-doped CVD oxide film, such as non-doped silicate glass (NSG), PE-SiH4 oxide, low $O_3$-TEOS oxide, high $O_3$-TEOS oxide, LP-TEOS oxide, high temperature oxide (HTO), and silicon substrate. More specifically, the TEOS oxide layer would not be formed on the thermal oxide layer, silicon nitride layer, or polysilicon layer. According to an embodiment of the invention, the TEOS oxide 110 is formed on the exposed bottom of the trench 106 instead of on the sidewalls of the trench 106 (i.e., oxide layer 108) and instead of on the silicon nitride layer 104. Few porous oxides 110', however, can be formed on the oxide layer 108 and the silicon nitride layer 104. The few porous oxides 110' in this embodiment are referred to as the fourth oxide.

Figure 6:
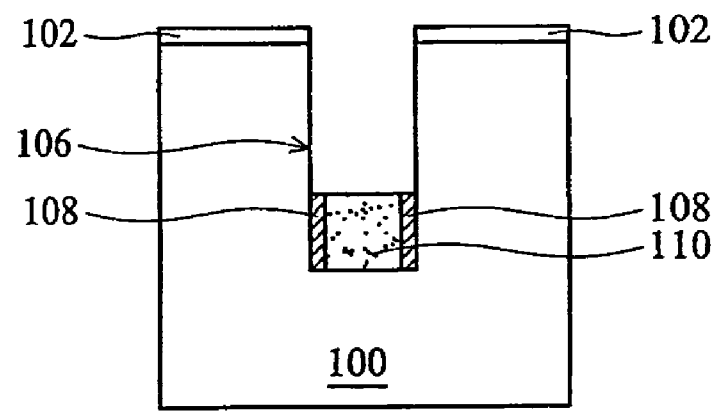

Referring FIG. 6, the porous oxides 110' are removed using wet etching, for example. According to an embodiment of the invention, the wet etching is performed by an HF based solution, preferably a buffered-oxide-etch (BOE) solution.

The etching selectivity of the porous oxide 110' and the TEOS oxide 110 in the HF based solution or in the BOE solution is quite large such that the porous oxide 110' can be removed without impediment.

Afterward, an annealing step is performed at a temperature in a range of approximately 800 to 1000° C., at a normal pressure, and with $N_2$ flow rate in a range of approximately 1000 to 12000 sccm in 10 to 20 min. According to a specific embodiment, the annealing step is performed at a temperature of 800° C., at a pressure lower than 760 torr, and with $N_2$ flow rate of 6000 sccm in 15 min.

After annealing, the oxide layer 110 is further densified with etch rate in the HF based solution or in the BOE solution substantially equal to the oxide layer 108. The oxide layer 108 on the sidewalls of the trench 106 is consequently removed leaving the thick oxide layer 110 at the bottom of the trench 106. The layer 108 is preferably removed by dry etching.

Next, the silicon nitride layer 104 is removed by wet etching, preferably, in a $H_3PO_4$ based solution.

Referring to FIG. 6 again, the oxide layer 102 is removed. Alternatively, this step can be unnecessary if the oxide layer 102 is omitted. The oxide layer 102 is removed by wet etching, preferably in the HF based solution or in the BOE solution.

Figure 7:
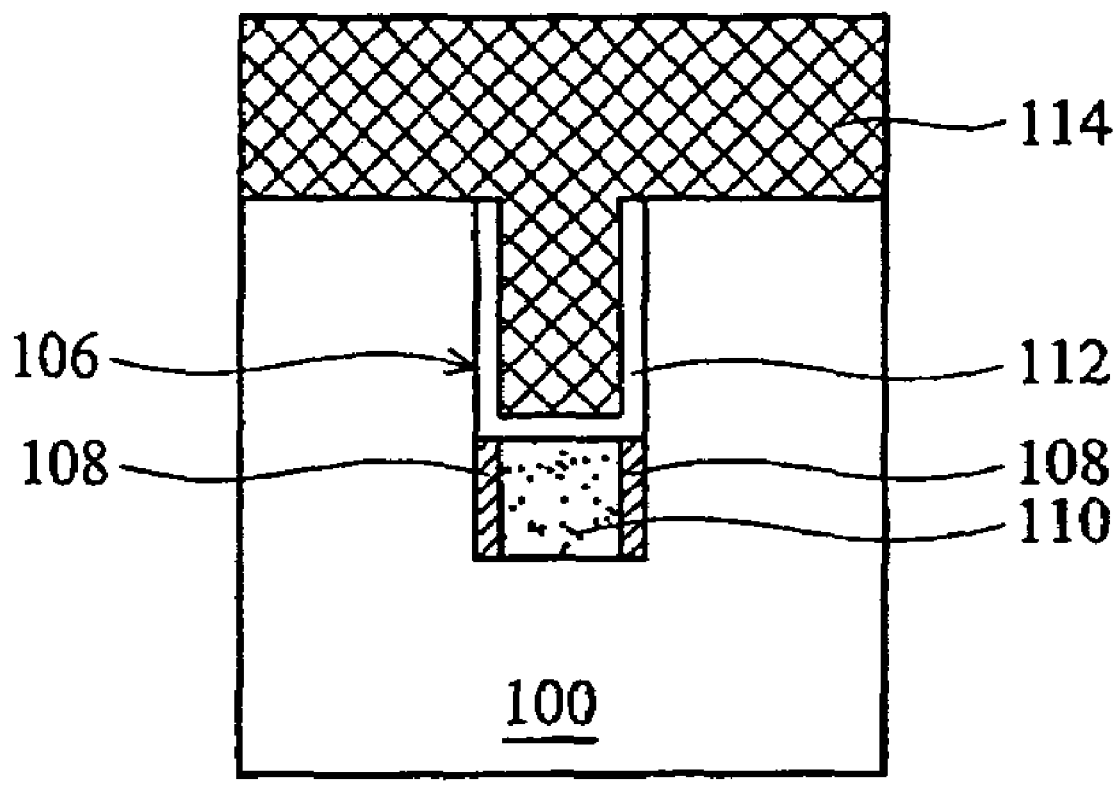

Consecutively, a dielectric layer 112 is conformally formed on the sidewalls of the trench 106. A conductive layer 114, such as polysilicon layer, is formed on the dielectric layer filling the trench 106, thus completing a fundamental structure of the power device, as shown in FIG. 7.

Some advantages of embodiments of the invention are that the TEOS oxide layer can be formed by high $O_3$-TEOS CVD at only 400° C. ameliorating thermal budget and stress issues. The thickness of the oxide layer at the bottom of the trench can also be easily controlled. In addition, the RC delay of the power device can be reduced as low as 1E-10A due to thick oxide layer at the bottom of the trench.

Accordingly, high density, low RC delay power devices with a thick oxide layer at the bottom of the trench can reduce production costs, simplify fabrication complexity, and increase yield.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for forming an oxide layer at the bottom of a trench, the method comprising:
   providing a first substrate with at least one trench therein;
   forming a first oxide layer on the bottom and sidewalls of the trench;
   removing the first oxide layer at the bottom of the trench to expose the bottom of the trench; and
   forming a second oxide layer at the bottom of the trench;
   wherein the second oxide layer is formed by chemical vapor deposition (CVD) of ozone-tetraethyloxysilane ($O_3$-TEOS) having a sufficiently high ratio of a flow rate of ozone to a flow rate of TEOS so as to form the second oxide layer on the exposed bottom of the trench and without forming the second oxide layer on the first oxide layer and on the first substrate.

2. The method as claimed in claim 1, wherein the first substrate is formed by:
   providing a substrate;
   forming a third oxide layer on the substrate;
   forming a silicon nitride layer on the third oxide layer;
   patterning the silicon nitride layer and the third oxide layer to form an opening; and
   etching the substrate along the opening to form the trench therein.

3. The method as claimed in claim 1, wherein the first oxide is formed by thermal oxidation.

4. The method as claimed in claim 1, wherein the second oxide is formed by:
   forming a fourth oxide layer on the first substrate filling the trench by chemical vapor deposition (CVD) of ozone-tetraethyloxysilane ($O_3$-TEOS) substantially without forming the second oxide layer except for few porous oxides on sidewalls of the first oxide layer and on the first substrate;
   removing the few porous oxides on the first substrate and on the sidewalls of the trench; and
   densification of the fourth oxide layer to form the second oxide layer.

5. The method as claimed in claim 1, wherein the flow rate of ozone is higher than the flow rate of TEOS by an order of magnitude.

6. The method as claimed in claim 5, wherein the flow rate of ozone is about 4000–6000 sccm and the flow rate of TEOS is about 175–375 sccm.

7. The method as claimed in claim 4, wherein removing the fourth oxide layer on the first substrate and on the sidewalls of the trench is performed by wet etching.

8. The method as claimed in claim 7, wherein the wet etching is performed by an HF based solution.

9. The method as claimed in claim 8, wherein the HF based solution is a buffered-oxide-etch (BOE) solution.

10. The method as claimed in claim 4, wherein the densification is performed by annealing.

11. The method as claimed in claim 1, wherein the first substrate comprises a silicon substrate.

12. The method as claimed in claim 1, wherein removing the first oxide layer at the bottom of the trench is performed by dry etching.

13. The method as claimed in claim 2, further comprising removing the remaining silicon nitride layer.

14. The method as claimed in claim 2, wherein the third oxide layer is formed by thermal oxidation.

15. The method as claimed in claim 2, wherein the silicon nitride layer is formed by chemical vapor deposition.

16. The method as claimed in claim 2, wherein patterning the silicon nitride layer comprises:
   forming a photoresist layer on the silicon nitride layer;
   exposing and developing the photoresist layer to expose the silicon nitride layer; and
   removing the exposed the silicon nitride layer.

17. A method for fabricating a power device, the method comprising:
   providing a substrate;
   forming a third oxide layer on the substrate;
   forming a silicon nitride layer on the third oxide layer;
   patterning the silicon nitride layer and the third oxide layer to form an opening;
   etching the substrate along the opening to form a trench therein;
   forming a first oxide layer on the bottom and sidewalls of the trench;
   removing the first oxide layer at the bottom of the trench to expose the bottom of the trench; and
   forming a second oxide layer at the bottom of the trench;
   wherein the second oxide layer is formed by chemical vapor deposition (CVD) of ozone-tetraethyloxysilane ($O_3$-TEOS) having a sufficiently high ratio of a flow rate of ozone to a flow rate of TEOS so as to form the second oxide layer on the exposed bottom of the trench and without forming the second oxide layer on the first oxide layer, on the third oxide layer, and on the silicon nitride layer.

18. The method as claimed in claim 17, further comprising:
   forming a dielectric layer in the trench; and
   forming a conductive layer on the dielectric layer.

19. The method as claimed in claim 18, wherein the conductive layer comprises a polysilicon layer.

20. The method as claimed in claim 17, further comprising:
   removing the third oxide layer;
   forming a dielectric layer in the trench; and
   forming a conductive layer on the dielectric layer.

21. The method as claimed in claim 20, wherein the conductive layer comprises a polysilicon layer.

22. The method as claimed in claim 17, wherein the first oxide layer is formed by thermal oxidation.

23. The method as claimed in claim 17, wherein the third oxide layer is formed by thermal oxidation.

24. The method as claimed in claim 17, wherein the second oxide is formed by:
   forming a fourth oxide layer on the first substrate filling the trench by chemical vapor deposition (CVD) of ozone-tetraethyloxysilane ($O_3$-TEOS) substantially without forming the second oxide layer except for few porous oxides on sidewalls of the first oxide layer and on the first substrate;
   removing the few porous oxides on the first substrate and on the sidewalls of the trench; and
   densification of the fourth oxide layer to form the second oxide layer.

25. The method as claimed in claim 17, wherein the flow rate of ozone is higher than the flow rate of TEOS by an order of magnitude.

26. The method as claimed in claim 25, wherein the flow rate of ozone is about 4000–6000 sccm and the flow rate of TEOS is about 175–375 sccm.

27. The method as claimed in claim 24, wherein removing the fourth oxide layer on the first substrate and on the sidewalls of the trench is performed by wet etching.

28. The method as claimed in claim 27, wherein the wet etching is performed by an HF based solution.

29. The method as claimed in claim 28, wherein the HF based solution is a buffered-oxide-etch (BOE) solution.

30. The method as claimed in claim 24, wherein the densification is performed by annealing.

31. The method as claimed in claim 17, wherein the silicon nitride layer is formed by chemical vapor deposition.

32. The method as claimed in claim 17, wherein the substrate comprises a silicon substrate.

33. The method as claimed in claim 17, wherein removing the first oxide layer at the bottom of the trench is performed by dry etching.

34. The method as claimed in claim 17, wherein the power device is a trench power device.

35. The method as claimed in claim 17, wherein patterning the silicon nitride layer comprises:
    forming a photoresist layer on the silicon nitride layer;
    exposing and developing the photoresist layer to expose the silicon nitride layer; and
    removing the exposed the silicon nitride layer.

36. A method for fabricating a power device, the method comprising:
    providing a substrate;
    forming a third oxide layer on the substrate;
    forming a silicon nitride layer on the third oxide layer;
    patterning the silicon nitride layer and the third oxide layer to form an opening;
    etching the substrate along the opening to form a trench therein;
    forming a first oxide layer on the bottom and sidewalls of the trench;
    removing the first oxide layer at the bottom of the trench to expose the bottom of the trench;
    forming a second oxide layer at the bottom of the trench;
    removing the remaining silicon nitride layer; and
    removing the first oxide on the sidewalls of the trench and the remaining third oxide layer;
    wherein the second oxide layer is formed by chemical vapor deposition (CVD) of ozone-tetraethyloxysilane (O$_3$-TEOS) having a sufficiently high ratio of a flow rate of ozone to a flow rate of TEOS so as to form the second oxide layer on the exposed bottom of the trench and without forming the second oxide layer on the first oxide layer and on the first substrate.

37. The method as claimed in claim 36, further comprising:
    forming a dielectric layer in the trench; and
    forming a conductive layer on the dielectric layer.

38. The method as claimed in claim 37, wherein the conductive layer comprises a polysilicon layer.

39. The method as claimed in claim 36, wherein the first oxide layer is formed by thermal oxidation.

40. The method as claimed in claim 36, wherein the third oxide layer is formed by thermal oxidation.

41. The method as claimed in claim 36, wherein the second oxide layer is formed by:
    forming a fourth oxide layer on the first substrate filling the trench by chemical vapor deposition (CVD) of ozone-tetraethyloxysilane (O$_3$-TEOS) substantially without forming the second oxide layer except for few porous oxides on sidewalls of the first oxide layer and on the first substrate;
    removing the few porous oxides on the first substrate and on the sidewalls of the trench; and
    densification of the fourth oxide layer to form the second oxide layer.

42. The method as claimed in claim 36, wherein the flow rate of ozone is higher than the flow rate of TEOS by an order of magnitude.

43. The method as claimed in claim 42, wherein the flow rate of ozone is about 4000–6000 sccm and the flow rate of TEOS is about 175–375 sccm.

44. The method as claimed in claim 41, wherein removing the fourth oxide layer on the first substrate and on the sidewalls of the trench is performed by wet etching.

45. The method as claimed in claim 44, wherein the wet etching is performed by an HF based solution.

46. The method as claimed in claim 45, wherein the HF based solution is a buffered-oxide-etch (BOE) solution.

47. The method as claimed in claim 41, wherein the densification is performed by annealing.

48. The method as claimed in claim 36, wherein the silicon nitride is formed by chemical vapor deposition.

49. The method as claimed in claim 36, wherein the substrate comprises a silicon substrate.

50. The method as claimed in claim 36, wherein removing the first oxide layer at the bottom of the trench and the remaining third oxide is performed by wet etching.

51. The method as claimed in claim 36, wherein the power device is a trench power device.

52. The method as claimed in claim 36, wherein patterning the silicon nitride layer comprises:
    forming a photoresist layer on the silicon nitride layer;
    exposing and developing the photoresist layer to expose the silicon nitride layer; and
    removing the exposed the silicon nitride layer.

* * * * *